United States Patent [19]

Ohsawa et al.

[11] 4,326,239
[45] Apr. 20, 1982

[54] PRINTED CIRCUIT BOARD

[75] Inventors: Mitsuo Ohsawa, Chigasaki; Masato Yamamura, Kamakura; Toshio Takahashi, Tokyo, all of Japan

[73] Assignee: Sony Corporation, Tokyo, Japan

[21] Appl. No.: 74,471

[22] Filed: Sep. 11, 1979

[30] Foreign Application Priority Data

Sep. 21, 1978 [JP] Japan ............................ 53-129884[U]

[51] Int. Cl.³ ............................................ H05K 01/18
[52] U.S. Cl. ................................... 361/410; 174/68.5;
174/112; 361/402
[58] Field of Search ............... 174/112, 68.5; 361/402, 361/410

[56] References Cited

U.S. PATENT DOCUMENTS

| | | | |
|---|---|---|---|
| 2,804,607 | 8/1957 | Nalle | 361/410 X |
| 3,296,360 | 1/1967 | Faler | 174/112 X |
| 3,410,949 | 11/1968 | Tischler | 174/112 X |
| 3,621,116 | 11/1971 | Adams | 174/68.5 |
| 3,917,984 | 11/1975 | Kong | 361/410 X |
| 3,955,023 | 5/1976 | Blakely | 174/68.5 X |
| 3,989,338 | 11/1976 | Gosser | 174/112 X |
| 4,130,722 | 12/1978 | Levijoki | 174/117 FF X |

OTHER PUBLICATIONS

Thomas Lesh, Painted Circuits, PF Reporter, vol. 10, May 1970, pp. 30,31, 92 to 94.

Primary Examiner—Richard R. Kucia
Attorney, Agent, or Firm—Hill, Van Santen, Steadman, Chiara & Simpson

[57] ABSTRACT

A printed circuit board includes an insulating board; at least one pair of conductive patterns arranged on the insulating board and spaced from each other by a predetermined length; and a paint layer formed in the space between the conductive patterns within a predetermined range.

3 Claims, 8 Drawing Figures

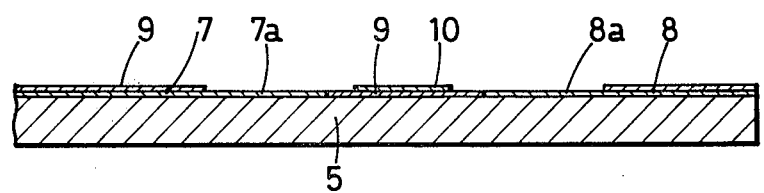
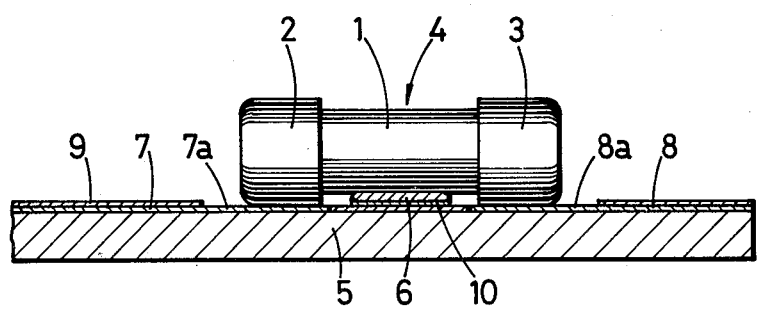
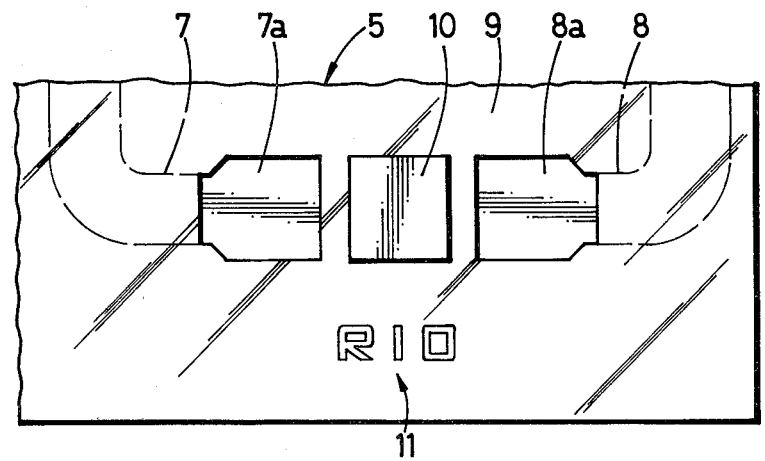

PRINTED CIRCUIT BOARD

BACKGROUND OF THE INVENTION

1. Field of the Invention

This invention relates to a printed circuit board, and more particularly to a printed circuit board on which leadless circuit-parts are mounted.

2. Description of the Prior Art

Hitherto, such a cylindrical leadless circuit-part 4 as shown in FIG. 1 and FIG. 2 is known. Caps 2 and 3 as electrodes are attached to both ends of a cylindrical body 1 in the cylindrical leadless circuit-part 4. In the mounting process, the cylindrical leadless circuit-part 4 is provisionally attached to a printed circuit board 5 with adhesive. FIG. 1 and FIG. 2 show the condition that the cylindrical circuit-part 4 is provisionally attached to a predetermined position on the printed circuit board 5 with adhesive 6. Patterns 7 and 8 of copper foil and a solder-resisting layer 9 are formed on the circuit board 5. The circuit-part 4 is provisionally attached to the circuit board 5 in the manner that the caps 2 and 3 of the circuit-part 4 contact with electrode portions 7a and 8a of the patterns 7 and 8. The printed circuit board 5 with the circuit-part 4 is dipped into a solder bath. Thus, the caps 2 and 3 of the circuit-part 4 are soldered to the electrode portions 7a and 8a of the patterns 7 and 8. The circuit-part 4 is firmly mounted on the circuit board 5 at a mechanically and electrically sufficient combining strength.

In the provisional attaching process, the predetermined position between the electrode portions 7a and 8a on which the circuit-part 4 should be mounted in the circuit board 5, is coated with adhesive 6 by a screen-printing method or a dispenser injection method, and then the circuit-part 4 is put on the predetermined position to be provisionally attached, as shown in FIG. 1 and FIG. 2. In this case, it is important that the predetermined position is accurately coated with adhesive 6 in a predetermined range. However, in the conventional printed circuit board, it cannot be easily discriminated whether the predetermined position has been accurately coated with adhesive 6 or not. Particularly in a hybrid integrated circuit in which numerous circuit-parts of such a kind are mounted, it is very difficult to find defects such as coating deflections from exact positions and blots from numerous coated positions with the naked eyes. Such difficulty causes the lowering of the working efficiency and the decrease of the reliability of the produced printed circuit board.

SUMMARY OF THE INVENTION

Accordingly, it is an object of this invention to provide a printed circuit board which overcomes the above-described demerits of the conventional printed circuit board.

Another object of this invention is to provide a printed circuit board in which defects such as coating deflections from exact positions and blots can be easily found with the naked eyes.

A further object of this invention is to provide a printed circuit board for which the working efficiency and the reliability are improved.

In accordance with an aspect of this invention, a printed circuit board includes an insulating board; at least one pair of conductive patterns arranged on the insulating board and spaced from each other by a predetermined length; and a paint layer formed in the space between the conductive patterns within a predetermined range.

Other objects, features, and advantages of the present invention will be apparent from the following description taken in conjunction with the accompanying drawings.

BRIEF DESCRIPTION OF THE DRAWINGS

FIG. 4 is a cross-sectional view taken along the line IV—IV on FIG. 3;

FIG. 5 is a side cross-sectional view for explaining that the cylindrical circuit-part is provisionally attached to the printed circuit board of FIG. 1;

FIG. 6 is a plan view of a part of a printed circuit board according to a second embodiment of this invention;

DESCRIPTION OF THE PREFERRED EMBODIMENTS

Figure 1:
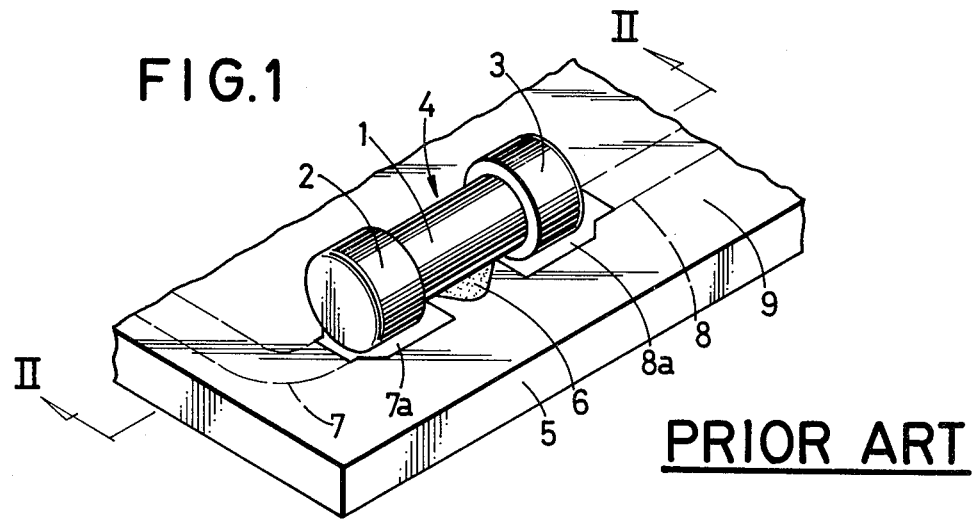
FIG. 1 is a perspective view of a part of a conventional printed circuit board, showing that a cylindrical circuit-part is provisionally attached to the board.
Figure 2:
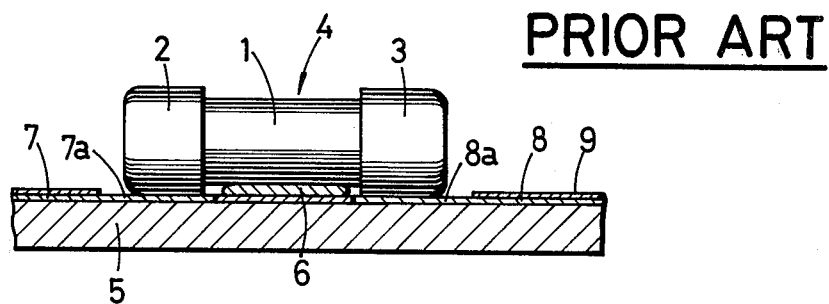
FIG. 2 is a cross-sectional view taken along the line II—II on FIG. 1.

Embodiments of this invention now will be described with reference to FIGS. 3 to 8. Parts in these embodiments which correspond to those in FIG. 1 and FIG. 2 are denoted by the same reference numerals.

Figure 3:
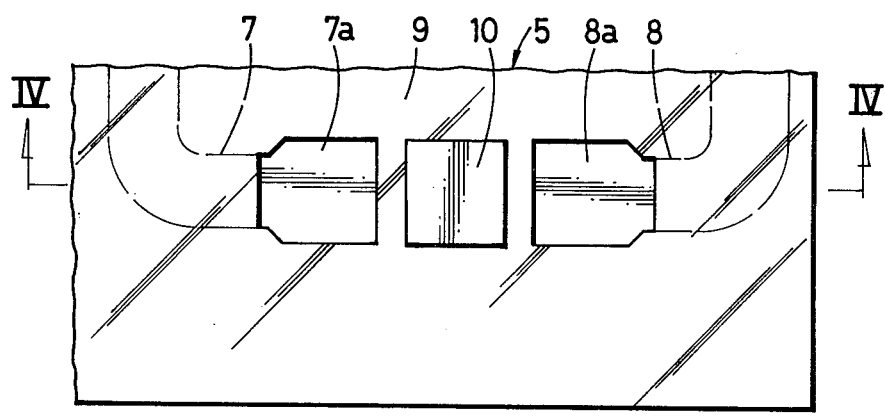
FIG. 3 is a plan view of a part of a printed circuit board according to a first embodiment of this invention.

FIG. 3 and FIG. 4 show a first embodiment of this invention. Referring to FIG. 3 and FIG. 4, a paint layer 10 is formed between electrode portions 7a and 8a of conductive patterns 7 and 8 by applying paint on a solder-resisting layer 9. The extent in which adhesive 6 is applied, is indicated by the paint layer 10. FIG. 5 shows that a cylindrical circuit-part 4 is provisionally attached to an insulating board 5 with adhesive 6 applied to the paint layer 10. Material which has a good affinity with a solder-resisting layer 9 and adhesive 6 is preferable for the paint layer 10. A thermosetting resin is generally used for the solder-resisting layer 9 and adhesive 6. However, an ultraviolet ray setting resin is more preferable for them, since it does not require a heating process in contrast to the thermosetting resin, and it is rapidly hardened by an ultraviolet ray. When the ultraviolet ray setting resin is used, blot of resin due to temperature rise is little, and thermal stress is minimized. Accordingly, although a thermosetting resin may be used as the paint layer 10, an ultraviolet ray setting resin is more preferable for the paint layer 10, since a sufficient combining strength and coating accuracy can be obtained for the provisional attachment.

The paint layer 10 may be formed by a screen printing method. Generally, circuit patterns on the board 5 are formed by an automatic drawing system using a computer. Informations on positions on which adhesive 6 should be applied are read out from the automatic drawing system. Positions for screen printing or dispenser injection can be determined on the basis of the informations read out from the automatic drawing system. When adhesive 6 is applied by the screen printing method, a film for forming screen is manufactured on the basis of the position informations read out from the automatic drawing system. Also, when the paint layer 10 is formed by the screen printing method, a film for forming a screen can be easily manufactured on the basis of the above-described informations. Examples of thicknesses of the patterns 7 and 8 are 35 μm. Those of the solder resisting layer 9 and paint layer 10 are 30 μm, and 10 to several tens μm, respectively. The paint layer 10 has a predetermined area which is so wide that a predetermined combining strength (for example, 2 kg in the horizontal direction of the drawing) can be obtained for the circuit-part 4 attached with adhesive 6 applied to the paint layer 10. The coating amount of adhesive 6 can be determined in the screen printing method or the dispenser injection method.

When the paint layer 10 and the adhesive are colored, they can be clearly discriminated. For example, when the solder resisting layer 9 is green, the paint layer is white, and adhesive 6 is sky-blue. The shape of the paint layer 10 may be square, circular or any other shape.

According to the above-described arrangement, defects such as coating deflection of adhesive 6 from the predetermined position and blots of adhesive 6 can be easily discriminated, since the paint layer 10 is formed on the predetermined position. Further, the positions on which the circuit-parts should be mounted, can be easily discriminated.

FIG. 6 shows a second embodiment of this invention. In the printed circuit board according to this embodiment, a letter or figure 11 representing the kind, number or denomination of a circuit-part to be mounted is printed on the board 5 near the electrode portions 7a and 8a of the patterns 7 and 8. Such a letter or figure is generally printed on a board in a recent printed circuit board. In the manufacture of the screen for printing the letter or figure 11 and paint layer 10, a film for the letter or figure 11 and another film for the paint layer 10 are superimposed on each other. Accordingly, the letter or figure 11 and the paint layer 10 are printed on the board 5 in one common process. An extra process for forming the paint layer 10 is not necessary.

Figure 7:
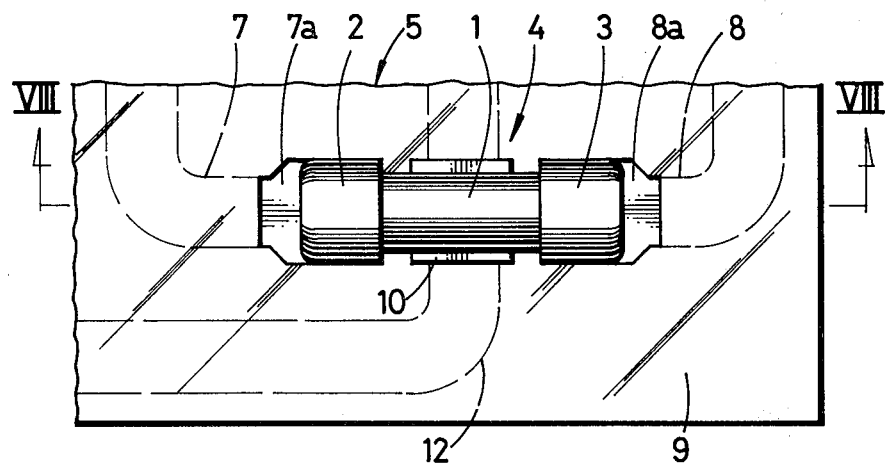
FIG. 7 is a plan view of a part of a printed circuit board according to a third embodiment of this invention.
Figure 8:
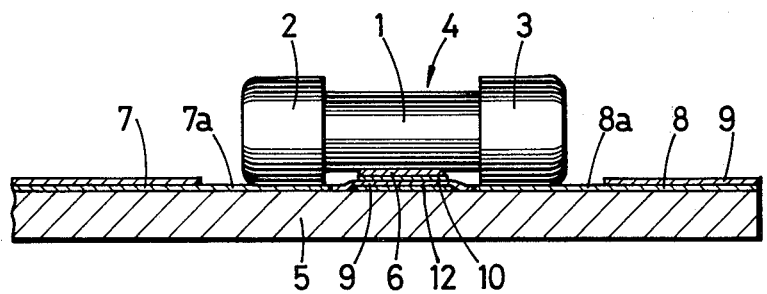
FIG. 8 is a cross-sectional view taken along the line VIII—VIII.

FIG. 7 and FIG. 8 show a third embodiment of this invention. In this embodiment, a cross pattern 12 is formed on the board 5 across the electrode portions 7a and 8a of the patterns 7 and 8. The paint layer 10 is formed above the cross pattern 12. Thus, the insulation between the circuit part 4 and the cross pattern 12 is improved in comparison with the conventional printed circuit board.

In the above-described embodiments, this invention is applied to a cylindrical leadless circuit-part. However, it may be applied also to a chip-like leadless circuit-part which is in the shape of rectangular parallelepiped and in which electrodes are fixed at its both ends.

As above described, this invention is directed to a printed circuit board in which there is provided a paint layer which indicates the extent to apply adhesive to fix the leadless circuit part. Accordingly, when the leadless circuit-part is provisionally attached to the board with adhesive, such defects as adhesive coating deflection from exact position and blots of adhesive can be easily discriminated. The working efficiency and reliability are improved. Further, positions on which circuit-parts are to be mounted can be discriminated with the naked eyes. And when a cross pattern is formed, the insulation between the circuit part and the cross cross pattern is improved.

While the preferred embodiment has been described, variations thereto will occur to those skilled in the art within the scope of the present inventive concepts which are delineated by the following claims.

We claim as our invention:

1. A printed circuit board comprising:
   (a) an insulating board;
   (b) at least one pair of conductive patterns arranged on said insulating board and spaced from each other by a predetermined length;
   (c) a solder resisting layer having a predetermined color formed on said insulating board;
   (d) an adhesive layer visual boundary guide in the form of a paint layer of insulating material formed on the solder resisting layer in the space between said conductive patterns within a predetermined range;
   (e) said paint layer having another color contrasting with said predetermined color of the solder resisting layer;
   (f) an adhesive layer applied onto said paint layer but not substantially beyond its boundaries;
   (g) a leadless electric part being fixed in contact with said conductive patterns with said adhesive layer; and
   (h) said paint layer having a good affinity with said solder resisting layer and adhesive layer such that said leadless electric part is fixed securely in position.

2. A printed circuit board according to claim 1, in which a letter or figure representing the kind, number or denomination of said leadless electric part to be mounted is printed adjacent to said paint layer.

3. A printed circuit board according to claim 1, in which another conductive cross pattern is formed on said insulating board between said pair of conductive patterns and under said solder resisting layer, said paint layer, and said adhesive.

* * * * *